(12) United States Patent
Sakamoto

(10) Patent No.: US 8,026,154 B2
(45) Date of Patent: Sep. 27, 2011

(54) LASER WORKING METHOD

(75) Inventor: Takeshi Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 195 days.

(21) Appl. No.: 12/305,497

(22) PCT Filed: Jun. 6, 2007

(86) PCT No.: PCT/JP2007/061461
§ 371 (c)(1),
(2), (4) Date: Dec. 18, 2008

(87) PCT Pub. No.: WO2008/004394
PCT Pub. Date: Jan. 10, 2008

(65) Prior Publication Data
US 2010/0009547 A1    Jan. 14, 2010

(30) Foreign Application Priority Data
Jul. 3, 2006    (JP) .............................. P2006-183476

(51) Int. Cl.
*H01L 21/00* (2006.01)

(52) U.S. Cl. . 438/463; 438/457; 438/795; 257/E21.596; 257/E21.028; 257/E21.134

(58) Field of Classification Search ................ 438/457, 438/463, 795, FOR. 333; 257/E23.148, E21.028, 257/E21.134, E21.596
See application file for complete search history.

(56) References Cited

FOREIGN PATENT DOCUMENTS

| | | |
|---|---|---|
| EP | 1 748 474 | 1/2007 |
| JP | 2004-087663 | 3/2004 |
| JP | 2005-109432 | 4/2005 |
| JP | 2005-129851 | 5/2005 |
| JP | 2006-245043 | 9/2006 |
| WO | 2005/098915 | 10/2005 |

OTHER PUBLICATIONS

Hayashi, K. "Inner Glass Marking by Harmonics of Solid-State Laser", Proceedings of $45^{th}$ Laser Materials Processing Conference, Dec. 1998, pp. 23-28.
Miura, K. et al. "Formation of Photo-Induced Structures in Glasses with Femtosecond Laser", Proceedings of $42^{nd}$ Laser Materials Processing Conference, Nov. 1997, pp. 105-111.
Sano, T. et al. "Evaluation of Processing Characteristics of Silicon with Picosecond Pulse Laser", Preprints of the National Meeting of Japan Welding Society, No. 66, Apr. 2000, pp. 72-73 (with corresponding English-language translation).

*Primary Examiner* — Michelle Estrada
(74) *Attorney, Agent, or Firm* — Drinker Biddle & Reath LLP

(57) ABSTRACT

An object to be processed is restrained from warping at the time of laser processing. A modified region M2 is formed within a wafer 11, and fractures a2, b2 extending in directions parallel to the thickness direction of the wafer 11 and tilted with respect to a plane including lines 5 are generated from the modified region M2. A modified region M3 is formed within the wafer 11, and a fracture a3 extending in a direction parallel to the thickness direction of the wafer 11 and tilted with respect to the plane including the lines 5 is generated from the modified region M3 so as to connect with the fracture b2. That is, the fractures a2, a3, b2 are generated so as to be connected together. Therefore, at the time of laser processing, the fractures cause both side parts holding the lines to cut 5 therebetween in the wafer 11 to mesh with each other, whereby internal stresses occurring in a direction parallel to the thickness direction of the wafer 11 and perpendicular to the surface including the lines 5 when the modified regions are formed can be reduced.

5 Claims, 22 Drawing Sheets

(a)

(b)

LASER WORKING METHOD

TECHNICAL FIELD

The present invention relates to a laser processing method for cutting a planar object to be processed along a line to cut.

BACKGROUND ART

Known as a conventional laser processing method is one irradiating a planar object to be processed with laser light while locating a converging point within the object, so as to form a modified region to become a cutting start point within the object along a line to cut the object (see, for example, Patent Document 1).

Patent Document 1: Japanese Patent Application Laid-Open No. 2005-129851

DISCLOSURE OF THE INVENTION

Problem to be Solved by the Invention

However, the following problem may occur at the time of laser processing in laser processing methods such as the one mentioned above, since the modified region is formed within the object. That is, when the modified region is formed within the object, an internal stress may occur in a direction which is parallel to the thickness direction of the object and perpendicular to a plane including the line to cut, thereby warping the object. The degree of warpage becomes remarkable in particular when making microchips such as discrete devices or forming a plurality of rows of modified regions for one line to cut. As a result, displacements of surfaces of the object may deviate from trackable ranges of autofocus functions for controlling converging positions of laser light provided in laser processing apparatus, or the object may be cut unintentionally.

It is therefore an object of the present invention to provide a laser processing method which can restrain the object from warping at the time of laser processing.

Means for Solving Problem

For achieving the above-mentioned object, the laser processing method in accordance with the present invention is a laser processing method for irradiating a planar object to be processed with laser light while locating a converging point within the object, so as to form a modified region to become a cutting start point within the object along a line to cut the object; the method including the steps of forming a first modified region within the object and generating from the first modified region a first fracture extending in a direction parallel to a thickness direction of the object and tilted with respect to a plane including the line to cut, and forming a second modified region within the object and generating from the second modified region a second fracture extending in a direction parallel to the thickness direction of the object and tilted with respect to the plane including the line to cut so as to connect with the first fracture.

This laser processing method irradiates the object to be processed with laser light while locating the converging point within the object, so as to form the first and second modified regions to become cutting start points within the object along the line to cut. This generates the first fracture extending from the first modified region in a direction parallel to the thickness direction of the object and tilted with respect to a plane including the line to cut and the second fracture extending from the second modified region in a direction parallel to the thickness direction of the object and tilted with respect to the plane including the line to cut, so that the first and second fractures connect with each other. That is, both side parts holding the line to cut therebetween in the object mesh with each other, thereby making it possible to reduce internal stresses occurring in directions parallel to the thickness direction of the object and tilted with respect to the plane including the line to cut when the modified regions are formed. As a result, the object can be restrained from warping at the time of laser processing.

Preferably, the method includes the step of irradiating the object with laser light while locating a converging point within the object, so as to form a third modified region to become a cutting start point within the object along the line to cut, and generating from the third modified region a third fracture extending in a direction parallel to the thickness direction of the object and tilted with respect to the plane including the line to cut, and the second fracture is generated from the second modified region so as to connect with the third fracture in the step of forming the second modified region and generating the second fracture.

In this case, at the time of laser processing, the third fracture extending in a direction parallel to the thickness direction of the object and tilted with respect to the plane including the line to cut is generated from the third modified region, and the second and third fractures connect with each other. That is, at the time of laser processing, the first, second, and third fractures cause both side parts holding the line to cut therebetween in the object to mesh with each other, thereby making it possible to further reduce internal stresses occurring in directions parallel to the thickness direction of the object and tilted with respect to the plane including the line to cut when the modified regions are formed. As a result, the object can further be restrained from warping at the time of laser processing. Here, the step of forming the first modified region and generating the first fracture and the step of forming the third modified region and generating the third fracture may be carried out in any order.

Preferably, the object is a crystal structure having a cleavage plane along a direction parallel to the thickness direction of the object and tilted with respect to the plane including the line to cut. Since this object is likely to break along the direction parallel to its thickness direction and tilted with respect to the plane including the line to cut, forming the modified regions can reliably generate fractures in this direction.

There is a case where the object is equipped with a semiconductor substrate, while the modified region includes a molten processed region.

Preferably, the method further includes the step of cutting the object along the line to cut from the modified region acting as the cutting start region. This can accurately cut the object along the line to cut.

Effect of the Invention

The present invention can restrain the object from warping at the time of laser processing.

EXPLANATIONS OF NUMERALS OR LETTERS 1, 50, 60 . . . object to be processed; 5 . . . line to cut; a1, a2, a3, a4, a5, a6, a8, a9, a10, b1, b2, b3, b4, b5, b6, b8, b9, b10 . . . fracture; M1, M2, M3, M5, M6, M8, M9, M10 . . . modified region; P . . . converging point

BEST MODES FOR CARRYING OUT THE INVENTION

In the following, preferred embodiments of the present invention will be explained in detail with reference to the drawings. In the laser processing methods in accordance with the embodiments, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 1:
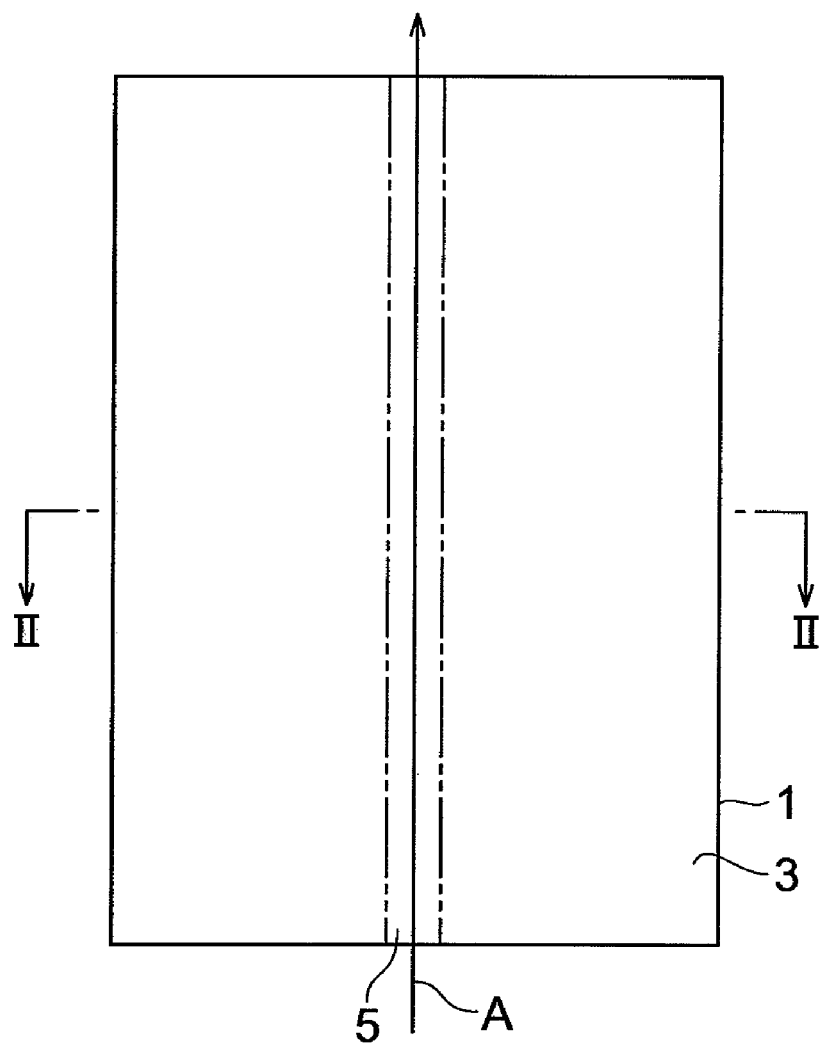
[FIG. 1] is a plan view of an object to be processed during laser processing by the laser processing apparatus in accordance with an embodiment.
Figure 2:
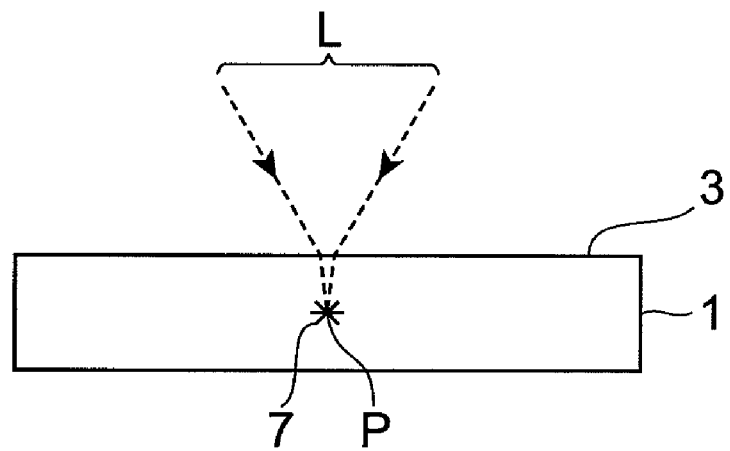
[FIG. 2] is a sectional view of the object taken along the line II-II of FIG. 1.

The principle of the laser processing method in accordance with an embodiment using such multiphoton absorption will be explained with reference to FIGS. 1 to 6. As shown in FIG. 1, on a front face 3 of a wafer-like (planar) object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
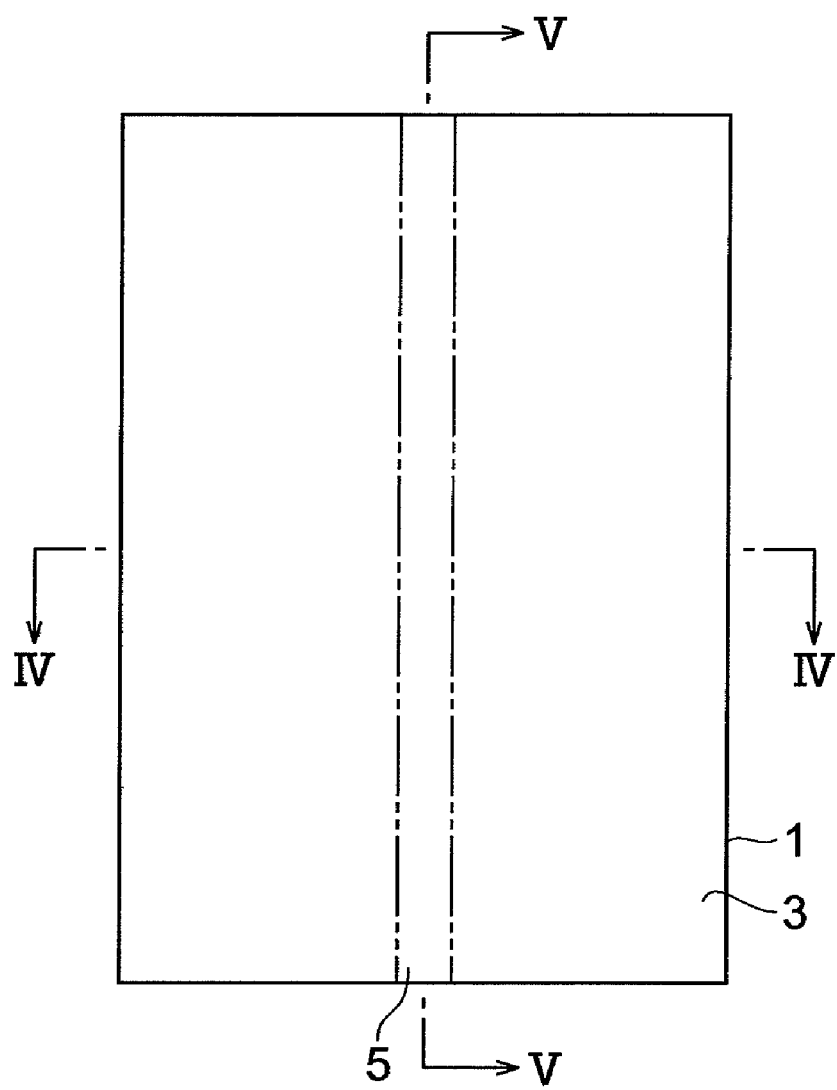
[FIG. 3] is a plan view of the object after the laser processing by the laser processing apparatus in accordance with the embodiment.
Figure 4:
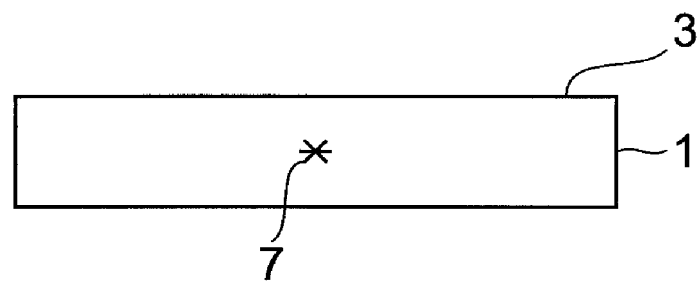
[FIG. 4] is a sectional view of the object taken along the line IV-IV of FIG. 3.
Figure 5:
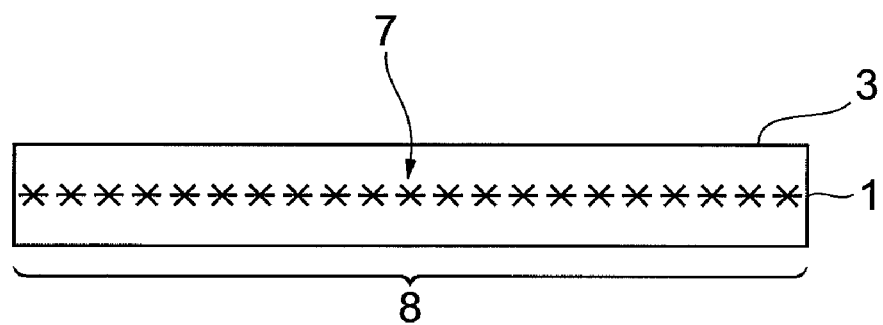
[FIG. 5] is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a cutting start region 8. The cutting start region 8 refers to a region which becomes a start point for cutting (fracturing) when the object 1 is cut. The cutting start region 8 may be made by forming the modified region 7 either continuously or intermittently.

In the laser processing method in accordance with this embodiment, the front face 3 of the object 1 hardly absorbs the laser light L and thus does not melt.

Figure 6:
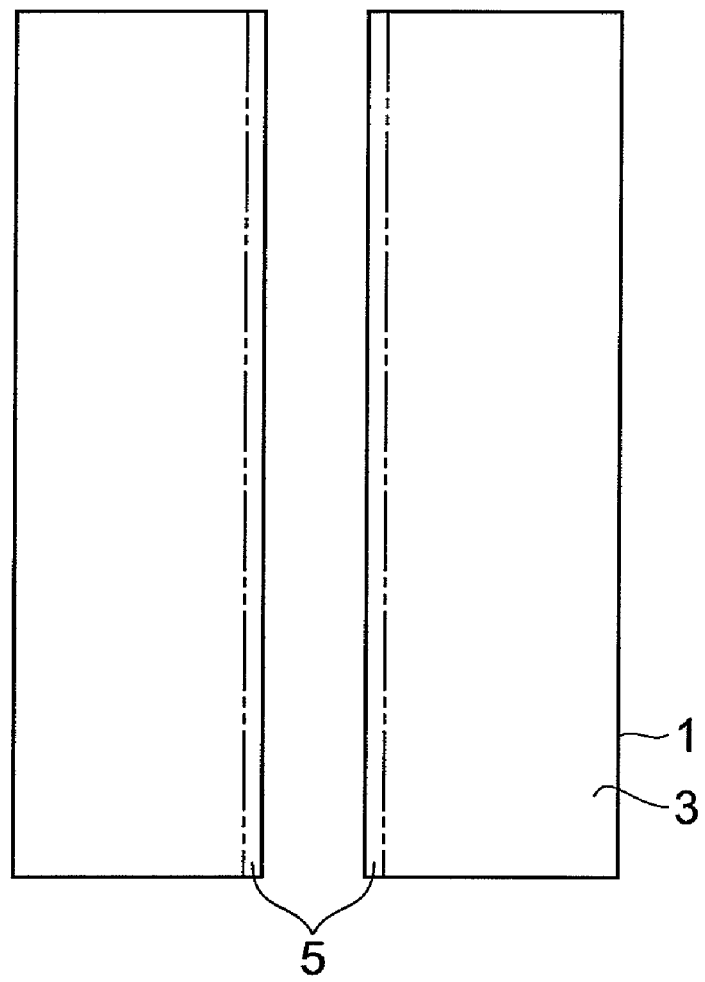
[FIG. 6] is a plan view of the object cut by the laser processing apparatus in accordance with the embodiment.

Forming the cutting start region 8 within the object 1 makes it easier to generate fractures from the cutting start region 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the cutting start region 8 acting as a start point. One is where an artificial force is applied to the object 1 after the cutting start region 8 is formed, so that the object 1 fractures from the cutting start region 8 acting as a start point, whereby the object 1 is cut. This is the cutting in the case where the object 1 has a large thickness, for example. Applying an artificial force refers to exerting a bending stress or shear stress on the object 1 along the cutting start region 8, or generating a thermal stress by applying a temperature difference to the object 1, for example. The other is where the forming of the cutting start region 8 causes the object 1 to fracture naturally in its cross-sectional direction (thickness direction) from the cutting start region 8 acting as a start point, thereby cutting the object 1. This becomes possible if the cutting start region 8 is formed by one row of the modified region 7 when the object 1 has a small thickness, or if the cutting start region 8 is formed by a plurality of rows of the modified region 7 in the thickness direction when the object 1 has a large thickness. Even in this naturally fracturing case, fractures do not extend onto the front face 3 at a portion corresponding to an area not formed with the cutting start region 8 in the part to cut, so that only the portion corresponding to the area formed with the cutting start region 8 can be cleaved, whereby cleavage can be controlled well. Such a cleaving method with a favorable controllability is very effective, since the object 1 to be processed such as silicon wafer has recently been apt to decrease its thickness.

The modified region formed by multiphoton absorption in the laser processing method in accordance with this embodiment encompasses the following cases (1) to (3):

(1) Case Where the Modified Region is a Crack Region Including one Crack or a Plurality of Cracks An object to be processed (e.g., glass or a piezoelectric material made of $LiTaO_3$) is irradiated with laser light while locating a converging point therewithin under a condition with a field intensity of at least $1\times10^8$ (W/cm$^2$) at the converging point and a pulse width of 1 µs or less. This magnitude of pulse width is a condition under which a crack region can be formed only within the object while generating multiphoton absorption without causing unnecessary damages to the front face of the object. This generates a phenomenon of optical damage by multiphoton absorption within the object. This optical damage induces a thermal distortion within the object, thereby forming a crack region therewithin. The upper limit of field intensity is $1\times10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (Registered Trademark) Glass (With a Thickness of 700 µm)

(B) Laser
Light source: semiconductor laser pumping Nd:YAG laser
Wavelength: 1064 nm
Laser light spot cross-sectional area: $3.14\times10^{-8}$ cm$^2$
Oscillation mode: Q-switched pulse
Repetition frequency: 100 kHz
Pulse width: 30 ns
Output: output<1 mJ/pulse
Laser light quality: $TEM_{00}$
Polarizing property: linear polarization (C) Condenser Lens
Transmittance at a laser light wavelength: 60%

(D) Moving rate of the mount table mounting the object: 100 mm/sec

The laser light quality of $TEM_{00}$ means that the converging characteristic is so high that convergence to about the wavelength of laser light is possible.

Figure 7:
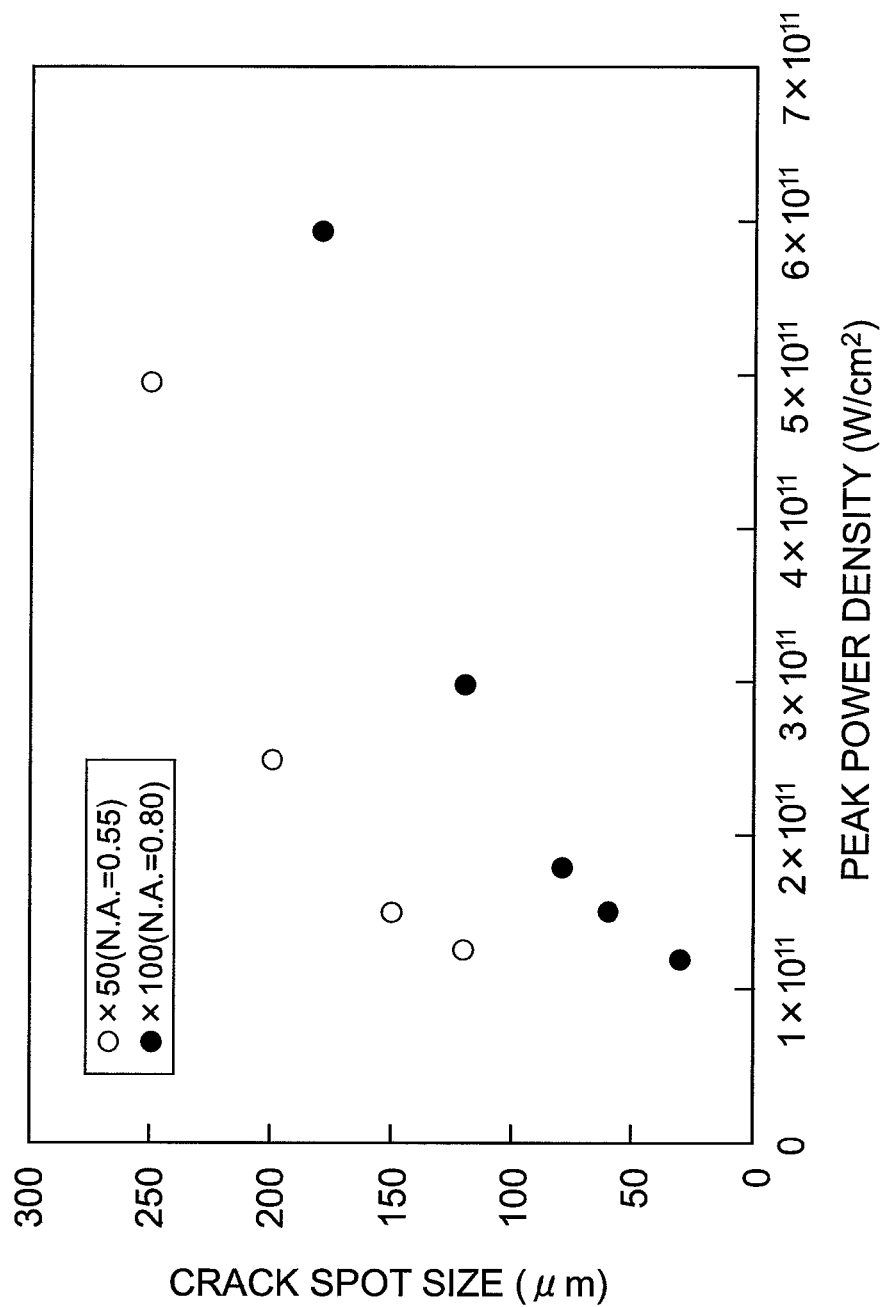
[FIG. 7] is a graph showing relationships between the field intensity and crack spot size in the laser processing apparatus in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
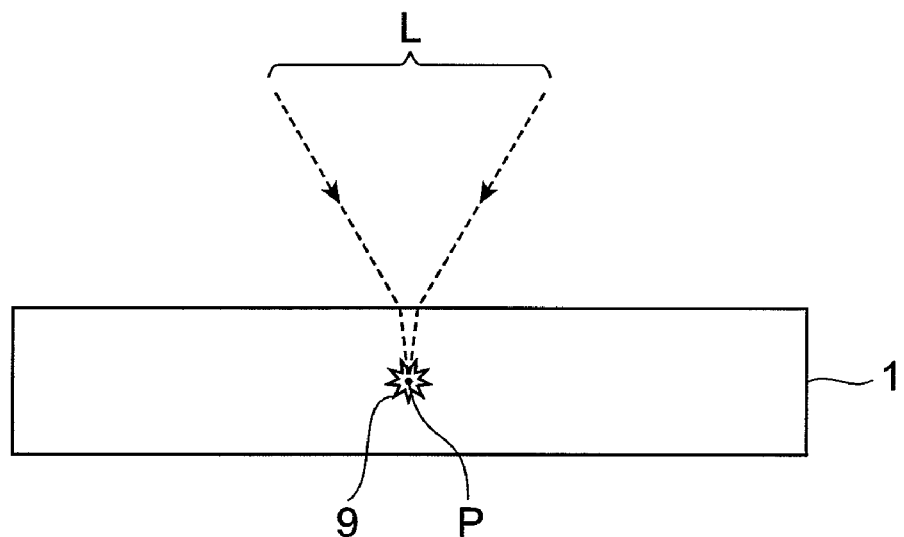
[FIG. 8] is a sectional view of the object in a first step of the laser processing apparatus in accordance with the embodiment.
Figure 9:
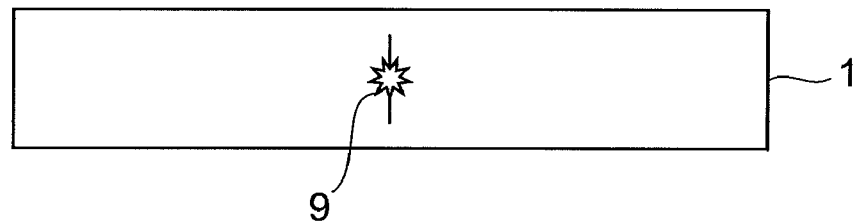
[FIG. 9] is a sectional view of the object in a second step of the laser processing apparatus in accordance with the embodiment.
Figure 10:
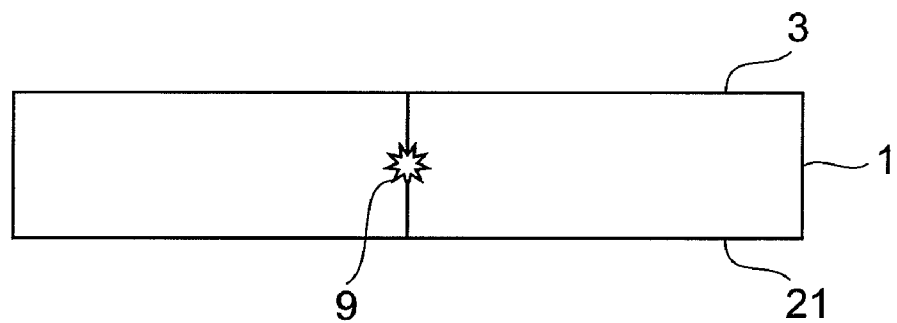
[FIG. 10] is a sectional view of the object in a third step of the laser processing apparatus in accordance with the embodiment.
Figure 11:
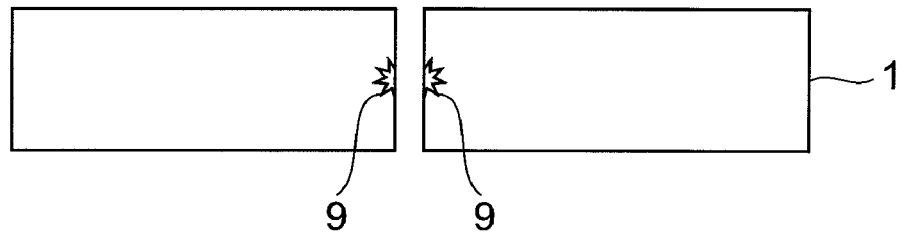
[FIG. 11] is a sectional view of the object in a fourth step of the laser processing apparatus in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a cutting start region. A crack further grows from the crack region 9 acting as a start point (i.e., from the cutting start region acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case Where the Modified Region is a Molten Processed Region

An object to be processed (e.g., semiconductor material such as silicon) is irradiated with laser light while locating a converging point within the object under a condition with a field intensity of at least $1\times10^8$ (W/cm$^2$) at the converging point and a pulse width of 1 µs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1\times10^{12}$ (W/cm$^2$), for example. The pulse width is preferably 1 ns to 200 ns, for example.

By an experiment, the inventors verified that a molten processed region was formed within a silicon wafer (semiconductor substrate). The following are conditions of the experiment.

(A) Object to be Processed: Silicon Wafer (With a Thickness of 350 µm and an Outer Diameter of 4 inches)

Figure 12:
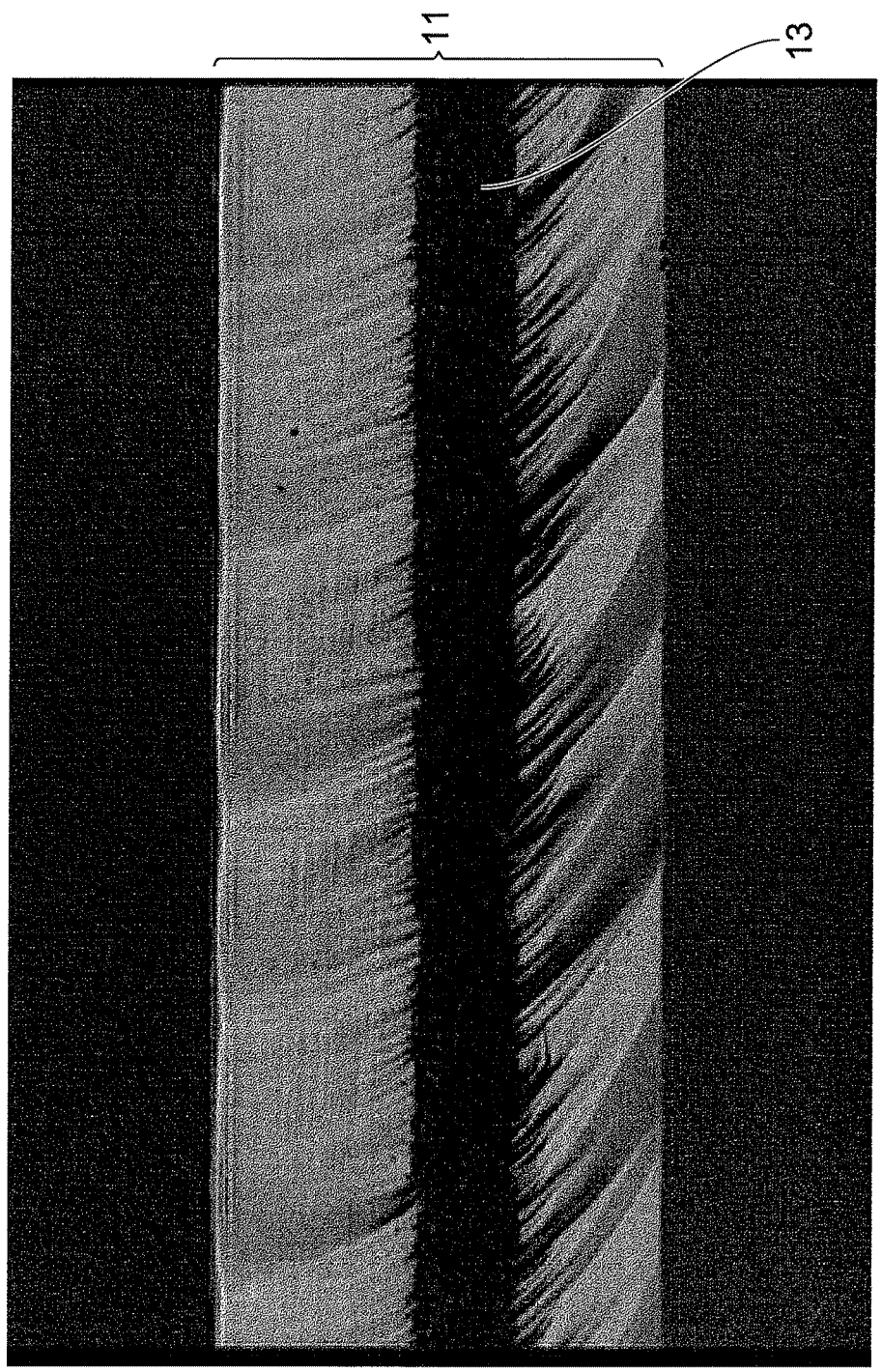
[FIG. 12] is a view showing a photograph of a cut section in a part of a silicon wafer cut by the laser processing apparatus in accordance with the embodiment.

(B) Laser
Light source: semiconductor laser pumping Nd:YAG laser
Wavelength: 1064 nm
Laser light spot cross-sectional area: $3.14\times10^{-8}$ cm$^2$
Oscillation mode: Q-switched pulse
Repetition frequency: 100 kHz
Pulse width: 30 ns Output: 20 μJ/pulse
Laser light quality: TEM$_{00}$
Polarizing property: linear polarization
(C) Condenser Lens
Magnification: ×50
N.A.: 0.55
Transmittance at a laser light wavelength: 60%
(D) Moving Rate of The Mount Table Mounting the Object: 100 mm/sec FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
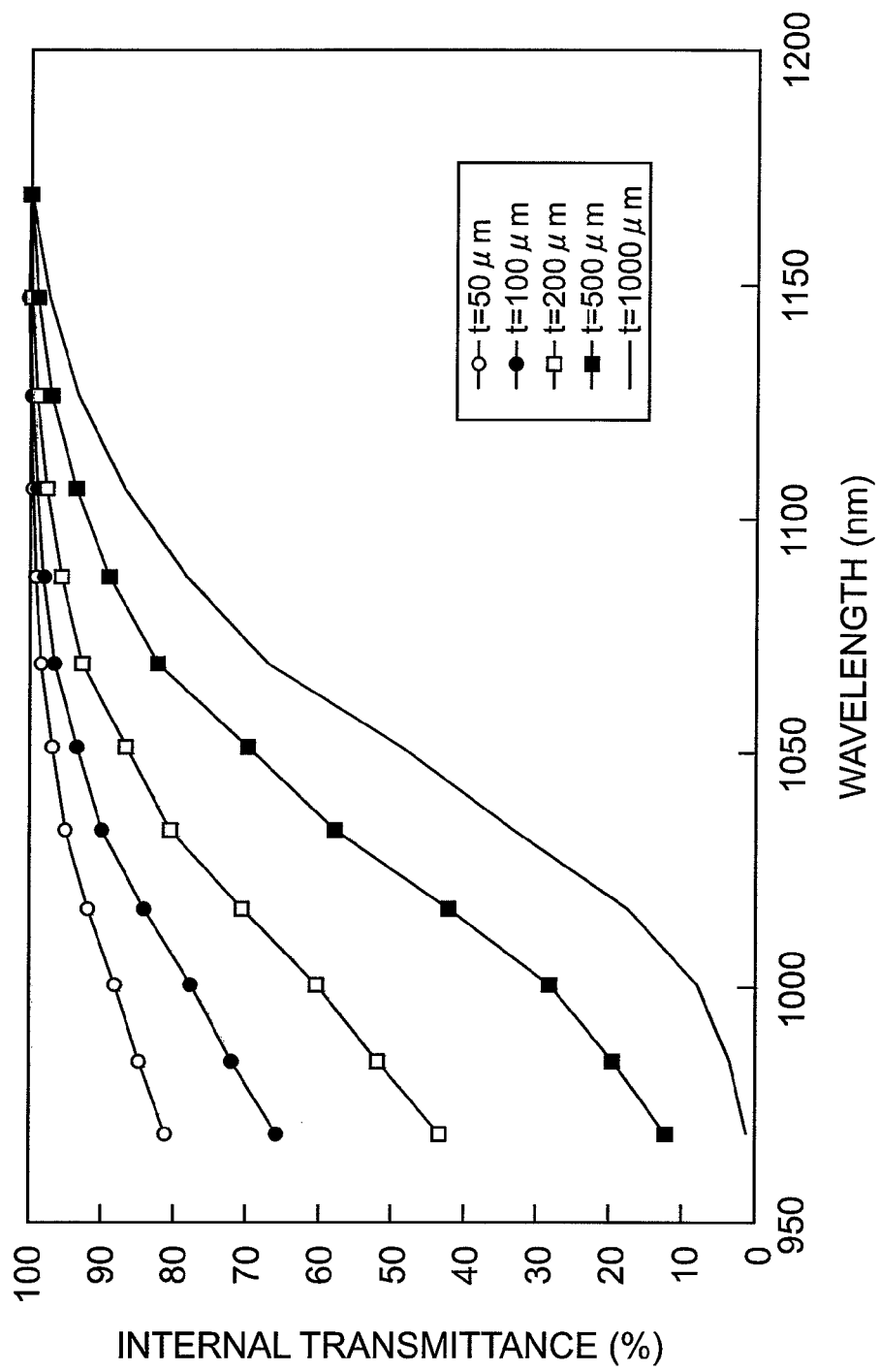
[FIG. 13] is a graph showing relationships between the laser light wavelength and the transmittance within a silicon substrate in the laser processing apparatus in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Ultrashort Pulse Laser Microprocessing of Silicon", Preprints of the National Meetings of Japan Welding Society, Vol. 66 (April, 2000), pp. 72-73.

A fracture is generated in a silicon wafer from a cutting start region formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the cutting start region to the front and rear faces of the silicon wafer encompasses a case where the fracture grows from a state in which the molten processed region forming the cutting start region is molten and a case where the fracture grows when the molten processed region forming the cutting start region is re-solidified from the molten state. In either case, the molten processed region is formed only within the silicon wafer, and thus is present only within the cut section after cutting as shown in FIG. 12. When a cutting start region is thus formed within the object by a molten processed region, unnecessary fractures deviating from a cutting start region line are harder to occur at the time of cleaving, whereby cleavage control becomes easier. Here, the molten processed region may be formed not only by multiphoton absorption but also by other absorption actions.

(3) Case Where the Modified Region is a Refractive Index Change Region

An object to be processed (e.g., glass) is irradiated with laser light while locating a converging point within the object under a condition with a field intensity of at least 1×10$^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is 1×10$^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

Though the cases (1) to (3) are explained in the foregoing as a modified region formed by multiphoton absorption, a cutting start region may be formed as follows while taking account of the crystal structure of a wafer-like object to be processed, its cleavage characteristic, and the like, whereby the object can be cut with a favorable precision by a smaller force from the cutting start region acting as a start point.

That is, in the case of a substrate made of a monocrystal semiconductor having a diamond structure such as silicon, it will be preferred if a cutting start region is formed in a direction extending along a (111) plane (first cleavage plane) or a (110) plane (second cleavage plane). In the case of a substrate made of a group III-V compound semiconductor of sphalerite structure such as GaAs, it will be preferred if a cutting start region is formed in a direction extending along a (110) plane. In the case of a substrate having a crystal structure of hexagonal system such as sapphire (Al$_2$O$_3$), it will be preferred if a cutting start region is formed in a direction extending along a (1120) plane (A plane) or a (1100) plane (M plane) while using a (0001) plane (C plane) as a principal plane.

When the substrate is formed with an orientation flat in a direction to be formed with the above-mentioned cutting start region (e.g., a direction extending along a (111) plane in a monocrystal silicon substrate) or a direction orthogonal to the former direction, the cutting start region extending in the direction to be formed with the cutting start region can be formed easily and accurately with reference to the orientation flat.

Preferred embodiments of the present invention will now be explained.

First Embodiment

Figure 14:
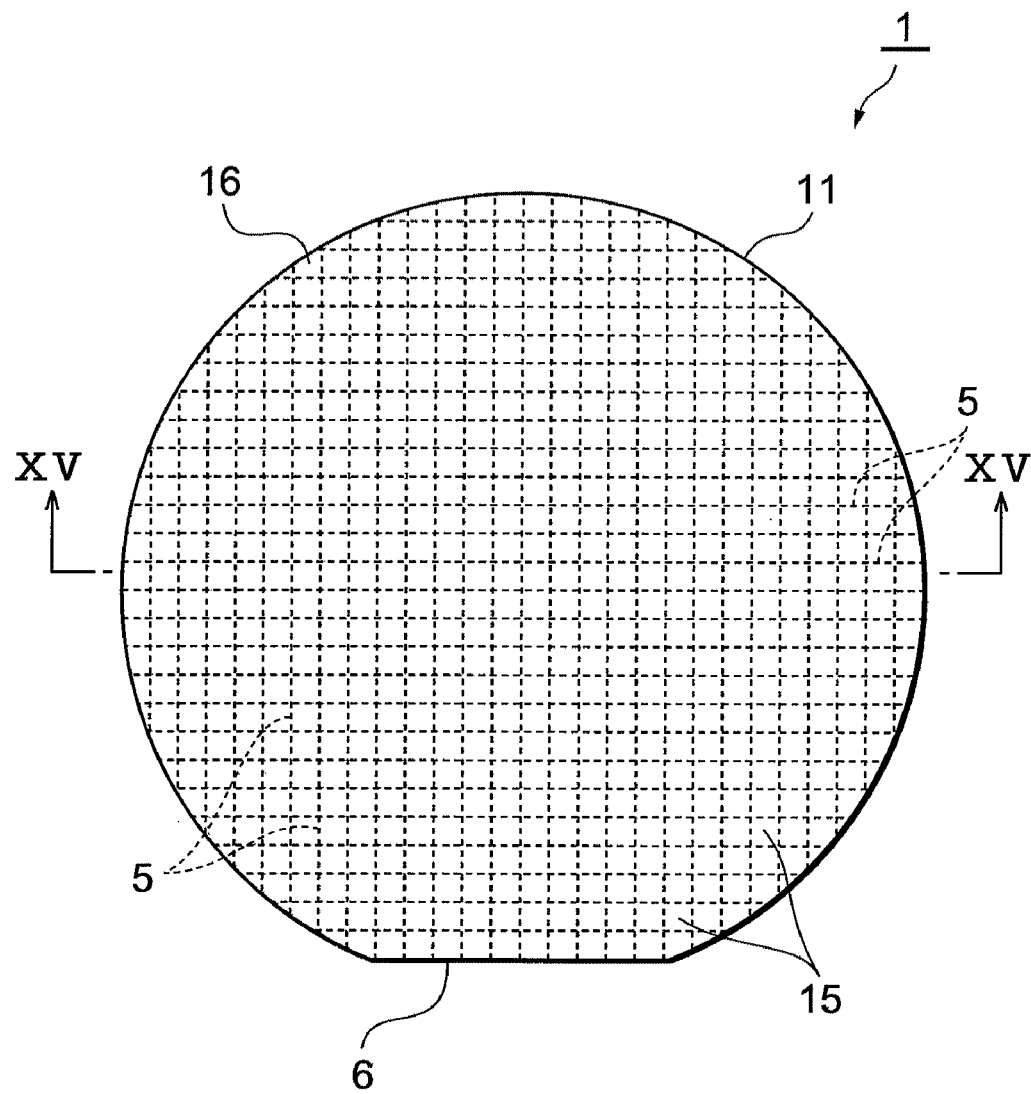
[FIG. 14] is a front view showing an object to be processed which is subjected to the laser processing method in accordance with a first embodiment of the present invention.
Figure 15:
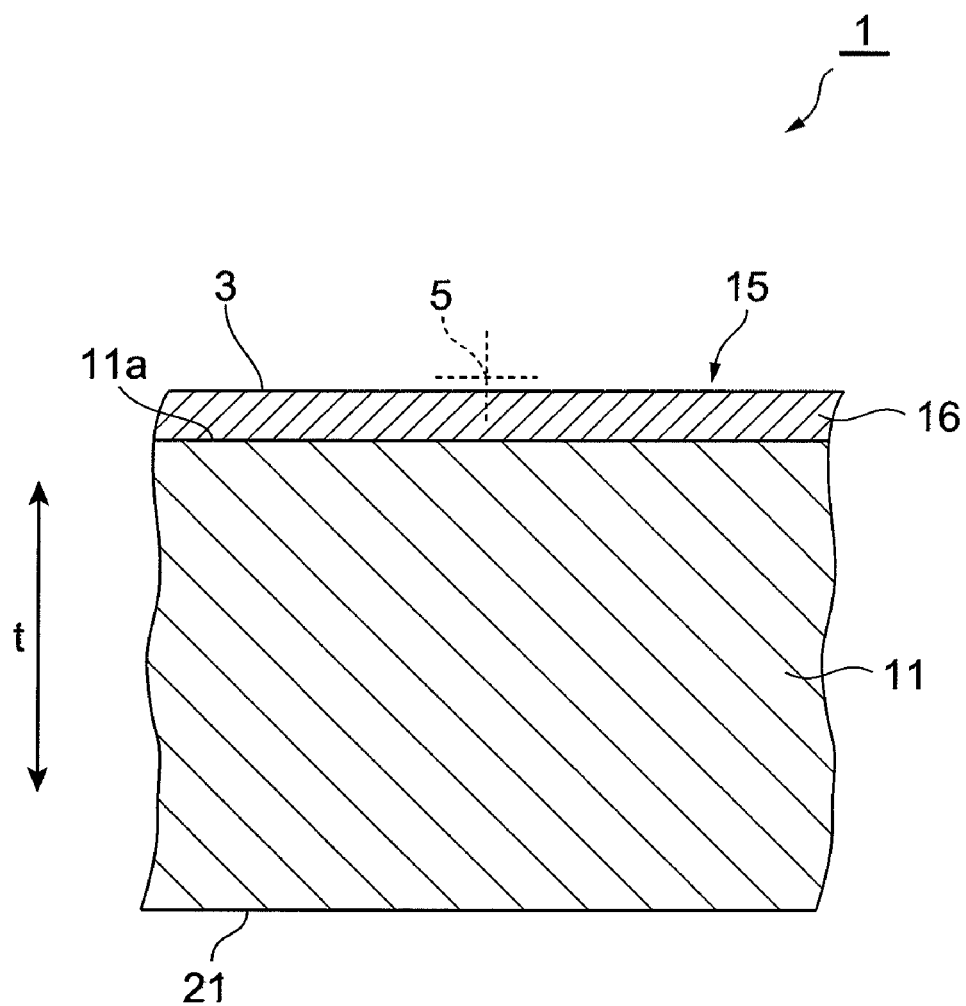
[FIG. 15] is a partial sectional view taken along the line XV-XV of FIG. 14.

As shown in FIGS. 14 and 15, an object to be processed 1 comprises a silicon wafer 11 having a diameter of 6 inches and a thickness of 132 μm, and a functional device layer 16 which is formed on the front face 11a of the silicon wafer 11a while including a plurality of functional devices 15. The silicon wafer 11 has such a crystal orientation that fractures are easy to extend in a direction different from its thickness direction t (hereinafter simply referred to as "thickness direction"). Specifically, the silicon wafer 11 is a crystal structure having a cleavage plane along a direction parallel to its thickness direction and tilted with respect to a plane including lines to cut 5, in which the front face 11a of the silicon wafer 11 is a (111) surface, for example.

A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11. Such an object to be processed 1 is cut by laser processing along lines to cut 5 (see broken lines in FIG. 14) which are set like grids such as to pass between adjacent functional devices, so as to yield discrete devices and the like which are microchips.

An example of cutting the object 1 will now be explained. First, an expandable tape, for example, is attached to the rear face 21 of the object 1. Subsequently, the silicon wafer 11 is irradiated with laser light while using the front face 3 of the silicon wafer 11 as a laser light irradiation surface and locating a converging point within the silicon wafer 11, so as to form a modified region along each line to cut 5 (laser processing). Then, the expandable tape is expanded. As a consequence, the object 1 is cut along the lines to cut 5 from the modified regions acting as cutting start points, whereby a plurality of semiconductor chips are separated from each other. The modified regions may include not only molten processed regions but also crack regions and the like.

The above-mentioned laser processing method will now be explained in more detail with reference to scanning along the line to cut 5 by way of example.

Figure 16:
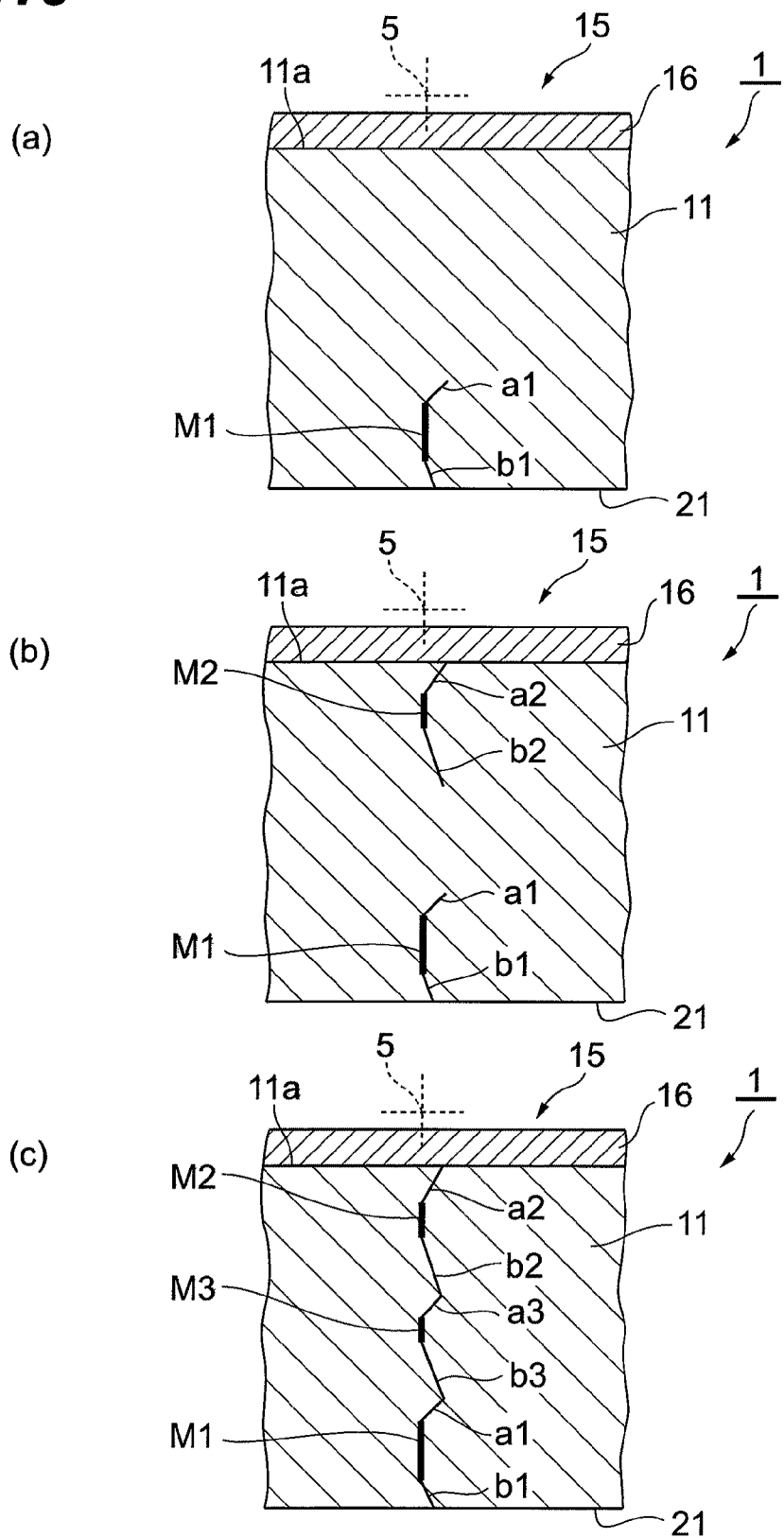
[FIG. 16] is a view for explaining the laser processing method in accordance with the first embodiment of the present invention.

First, as shown in FIG. 16(a), the object 1 is irradiated with laser light at a laser light output of 0.92 W while locating its converging point within the silicon wafer 11 in the vicinity of the rear face 21, so as to form a modified region M1 at a position distanced by 4 μm to 32 μm in the thickness direction from the rear face 21. Subsequently, the converging point is scanned at a processing speed of 300 mm/sec, for example, along the line to cut 5, so as to form one row of modified region M1 within the silicon wafer 11. As a consequence, fractures a1, b1 extending in directions parallel to the thickness direction of the silicon wafer 11 and tilted with respect to the plane including the lines to cut 5 are generated from the upper and lower ends of the modified region M1, respectively.

Here, the silicon wafer 11 is a crystal structure having such a cleavage plane as that mentioned above and thus is likely to break along directions parallel to its thickness direction and tilted with respect to the plane including the lines to cut 5. Therefore, the fractures a1, b1 favorably occur in these directions when forming the modified region M1. Here, the fracture a1 extends in the first cleavage direction of the silicon wafer 11, which is specifically a direction having an angle of 54.7°. The fracture b1 extends in the second cleavage direction of the silicon wafer 11, which is specifically a direction having an angle of 19.5°.

Next, as shown in FIG. 16(b), the object 1 is irradiated with laser light at a laser light output of 0.40 W while locating its converging point within the silicon wafer 11 in the vicinity of the front face 11a, so as to form a modified region M2 at a position distanced by 16 μm to 34 μm in the thickness direction from the front face 11a. Subsequently, the converging point is scanned at a processing speed of 300 mm/sec, for example, along the line to cut 5, so as to form one row of modified region M2 within the silicon wafer 11. As a consequence, fractures a2, b2 extending in the first and second cleavage directions of the silicon wafer 11 are generated from the upper and lower ends of the modified region M2, respectively. Here, the modified region M2 is formed such that the fracture a2 extending from the upper end of the modified region M2 reaches the front face 3 of the silicon wafer 11, i.e., the fracture 2 is exposed (so as to yield a so-called half-cut state) along the line to cut 5 in the front face 3. As a consequence, the object 1 can accurately be cut along the lines to cut 5 into a plurality of semiconductor chips by expanding the expandable tape, for example.

Next, as shown in FIG. 16(c), the object 1 is irradiated with laser light at a laser light output of 0.80 W while locating its converging point between the modified regions M1 and M2 within the silicon wafer 11, so as to form a modified region M3 at a position distanced by 59 μm to 69 μm in the thickness direction from the front face 11a. Subsequently, the converging point is scanned at a processing speed of 300 mm/sec, for example, along the line to cut 5, so as to form one row of modified region M3 within the silicon wafer 11. As a consequence, a fracture a3 extending in the first cleavage direction of the silicon wafer 11 is generated from the upper end of the modified region M3 so as to connect with the fracture b2 extending from the lower end of the modified region M2, and a fracture b3 extending in the second cleavage direction of the silicon wafer 11 is generated from the lower end of the modified region M3 so as to connect with the fracture a1 extending from the upper end of the modified region M2. Though the modified region M2 already formed between the front face 3 where laser light is incident and the converging point of the laser light may scatter or absorb the laser light and so forth when forming the modified region M3, this embodiment reliably forms the modified region M3 within the silicon wafer 11 along the line to cut 5 as mentioned above.

As explained in the foregoing, while utilizing at least two cleavage directions in the silicon wafer 11 by forming the modified regions M1, M2, M3, the fact that fractures are likely to extend in directions of fractures which have already occurred is used for generating the fractures a3, b3 from the modified region M3 so that they connect with the fractures a1, a2, b1, b2. Hence, fractures are induced in the cleavage directions in the silicon wafer 11, so as to form an irregular surface along the fractures.

When the modified region M1 is taken as the first modified region, the modified regions M3 and M2 correspond to the second and third modified regions, respectively. In this case, the fractures a1, b1 correspond to the first fracture, the fractures a3, b3 correspond to the second fracture, and the fractures a2, b2 correspond to the third fracture. When the modified region M2 is taken as the first modified region, on the other hand, the modified regions M3 and M1 correspond to the second and third modified regions, respectively. In this case, the fractures a2, b2 correspond to the first fracture, the fractures a3, b3 correspond to the second fracture, and the fractures a1, b1 correspond to the third fracture.

Here, when the object 1 is irradiated with laser light while locating its converging point within the silicon wafer 11, so as to form a modified region therewithin, an internal stress may occur in a direction H parallel to the thickness direction of the silicon wafer 11 and perpendicular to a plane including lines to cut at the time of laser processing as shown in FIG. 17(a), thereby causing warpage in the object 1. In the conventional laser processing method, as a consequence, the object 1 may be cut unintentionally when scanning the converging point of laser light along the line to cut 5, for example, as shown in FIG. 17(b).

Figure 17:
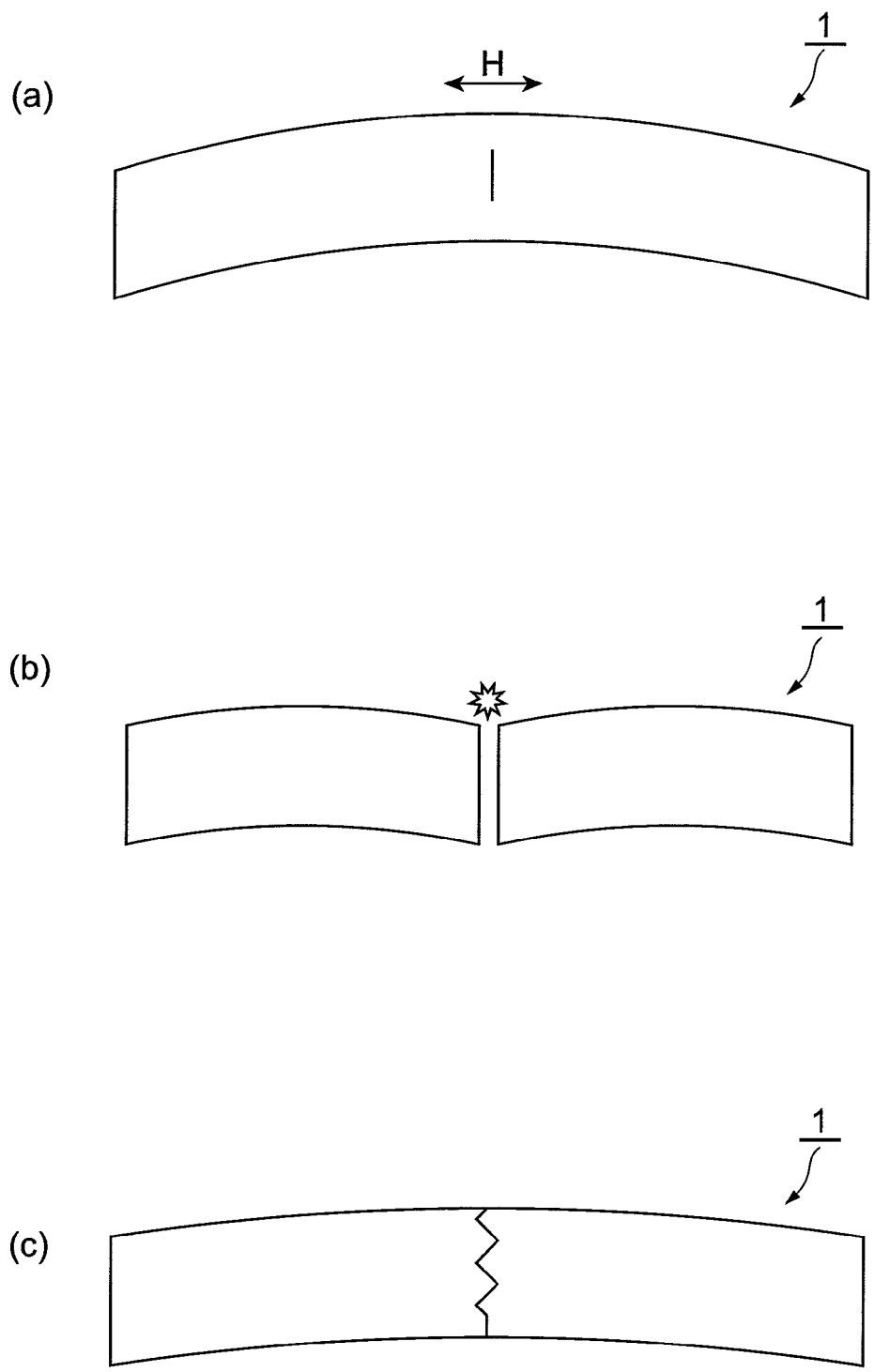
[FIG. 17] is a view for explaining an action of the laser processing method shown in FIG. 16.

Therefore, as mentioned above, the laser processing method in accordance with this embodiment irradiates the object 1 with laser light while locating the converging point within the silicon wafer 11, so as to form the modified regions M1, M2, M3 to become cutting start points within the object along the lines to cut 5, whereby the fractures a1, a2, a3, b1, b2, b3 are generated in directions parallel to the thickness direction of the silicon wafer 11 and tilted with respect to the plane including the lines to cut 5 so as to be connected together. Consequently, as shown in FIG. 17(*c*), these fractures cause both side parts holding the lines to cut 5 therebetween in the silicon wafer 11 to mesh with each other, thereby making it possible to reduce internal stresses occurring when the modified regions M1, M2, M3 are formed. In other words, the fractures a1, a2, a3, b1, b2, b3 form an irregular surface in the silicon wafer 11, while shear forces acting on this surface can reduce the internal stresses. This can restrain the object 1 from warping and prevent it from being cut unintentionally at the time of laser processing. As a consequence, autofocus functions for controlling converging positions of laser light provided in laser processing apparatus can reliably track surfaces of the object 1, whereby the object 1 can accurately be laser-processed.

As mentioned above, the silicon wafer 11 is a crystal structure in which the crystal orientation of the front face 3 is in a (111) surface, so that fractures are likely to extend in directions different from its thickness direction, i.e., having cleavage directions different from the thickness direction. Therefore, when laser-processing such a crystal structure, there is a case where the conventional laser processing method carries out scanning such that modified regions are overlaid on each other in the thickness direction along one line to cut in order to cut the object 1 accurately regardless of its cleavage directions. In this case, however, the number of scans increases, while the cleavage directions differ from cut sections, so that the cutting force for cutting the object 1 into a plurality of semiconductor chips becomes greater, thereby limiting the size of chips which can be manufactured.

Further, when laser-processing such a crystal structure, there is a case where the conventional laser processing method forms a modified region near the front or rear face of the silicon wafer and cuts it by applying an external force thereto. Though this can reduce the number of scans, two or more cleavage directions are not utilized, i.e., the object is cut by only one cleavage direction different from the thickness direction, whereby fractures may grow so much along the one cleavage direction upon cutting, thus tilting cut sections greatly with respect to the thickness direction.

In this regard, when forming the modified regions M1, M2, M3 to become cutting start points within the silicon wafer 11, the laser processing method in accordance with this embodiment utilizes at least two cleavage directions in the silicon wafer 11, so as to generate the fractures a1, a2, a3, b1, b2, b3 in directions parallel to its thickness direction and tilted with respect to the plane including the lines to cut 5 such that they are connected together. This allows the cut sections to coincide with the cleavage directions, so that the object 1 can be cut with a relatively small external force, while the cut sections can attain a favorable quality.

Figure 18:
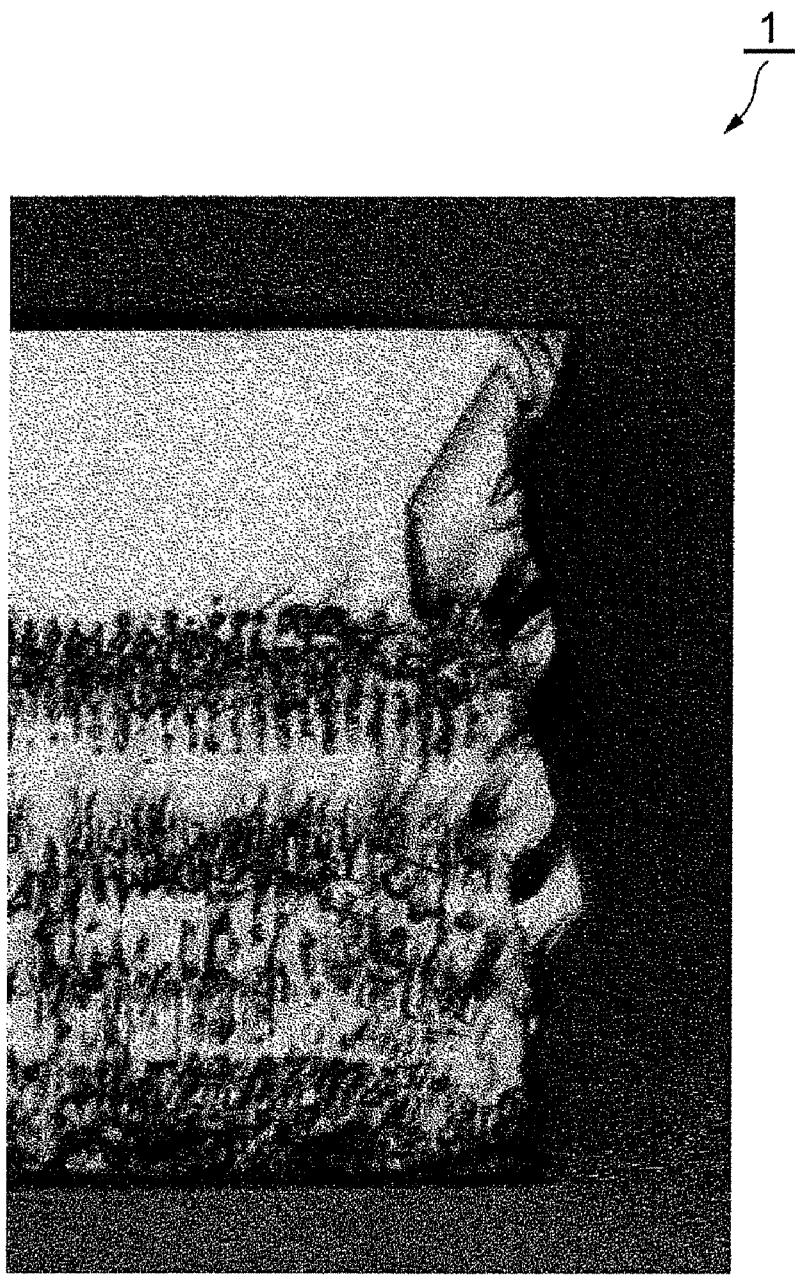
[FIG. 18] is a view showing the state of a cut section of the object cut by the laser processing method shown in FIG. 16.

FIG. 18 is a sectional view showing the state of a cut section of the object 1 cut by the laser processing method in accordance with this embodiment. This embodiment can yield irregular cut sections when cutting the object 1. The height from the most recessed part to the most projected part in this cut section is 12 to 13 µm, which can sufficiently satisfy a standard value of 20 µm or less in typical discrete devices, for example.

Figure 19:
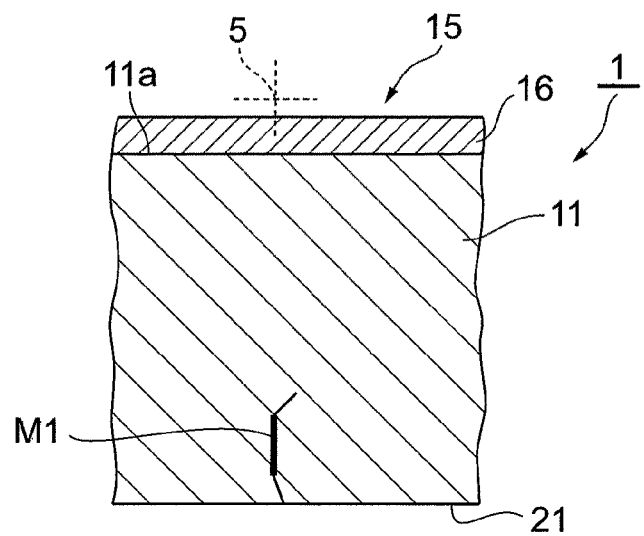
[FIG. 19] is a view for explaining another example of the laser processing method shown in FIG. 16.
Figure 19:
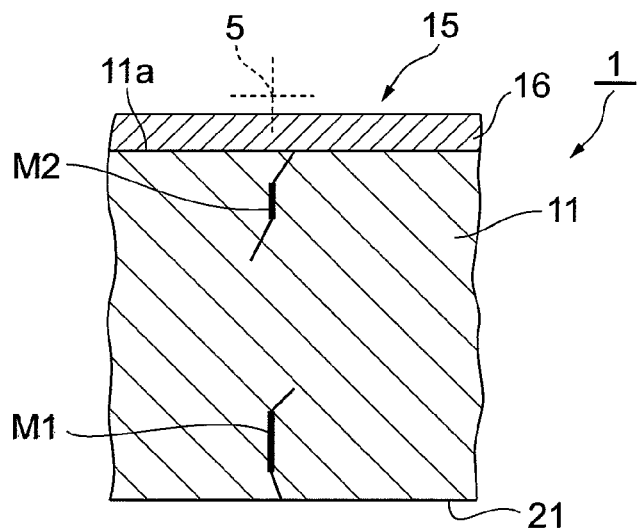
Figure 19:
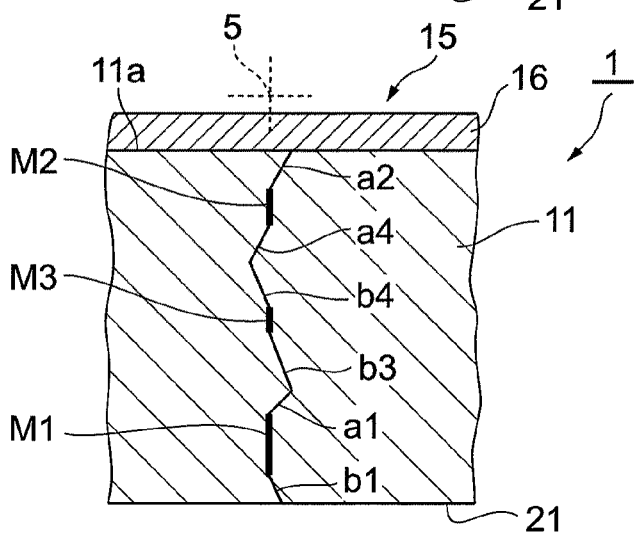

FIG. 19 shows another example of scan along a given line to cut 5 by the laser processing method in accordance with this embodiment. This example differs from the above-mentioned one shown in FIG. 16 in that a fracture a4 extending in the first cleavage direction of the silicon wafer 11 from the lower end of the modified region M2 is generated when forming the latter, a fracture b4 extending in the second cleavage direction from the upper end of the modified region M3 is generated when forming the latter, and the fractures a1, a2, a4, b1, b2, b4 are connected together.

This example exhibits the same effects as those mentioned above in that fractures are induced in the cleavage directions in the silicon wafer 11, so as to form irregular surfaces along the fractures, whereby both side parts holding the lines to cut 5 therebetween in the silicon wafer 11 mesh with each other at the time of laser processing, so as to restrain the object 1 from warping and prevent the object 1 from being cut unintentionally. Thus, the directions of fractures are not limited to the example shown in FIG. 16, but may be any of the first and second cleavage directions of the silicon wafer 11. The fractures may extend in other cleavage directions (i.e., directions which are different from the first and second cleavage directions while being parallel to the thickness direction of the silicon wafer 11 and tilted with respect to the plane including the lines to cut 5) as a matter of course. The same holds true for directions of fractures which will be explained later.

When the modified region M1 is taken as the first modified region, the modified regions M3 and M2 correspond to the second and third modified regions, respectively. In this case, the fractures a1, b1 correspond to the first fracture, the fractures b3, b4 correspond to the second fracture, and the fractures a2, a4 correspond to the third fracture. When the modified region M2 is taken as the first modified region, on the other hand, the modified regions M3 and M1 correspond to the second and third modified regions, respectively. In this case, the fractures a2, a4 correspond to the first fracture, the fractures b3, b4 correspond to the second fracture, and the fractures a1, b1 correspond to the third fracture.

Second Embodiment

The laser processing method in accordance with the second embodiment employs, as its object to be processed, an object to be processed 50 equipped with a silicon wafer 51 which is the same as the silicon wafer 11 shown in FIGS. 14 and 15 except that its thickness is 96 µm. This laser processing method differs from that of the first embodiment in that the modified region M3 is not formed between the modified regions M1 and M2 within the silicon wafer when forming the modified regions along lines to cut by irradiating the silicon wafer with laser light while locating a converging point within the silicon wafer.

Figure 20:
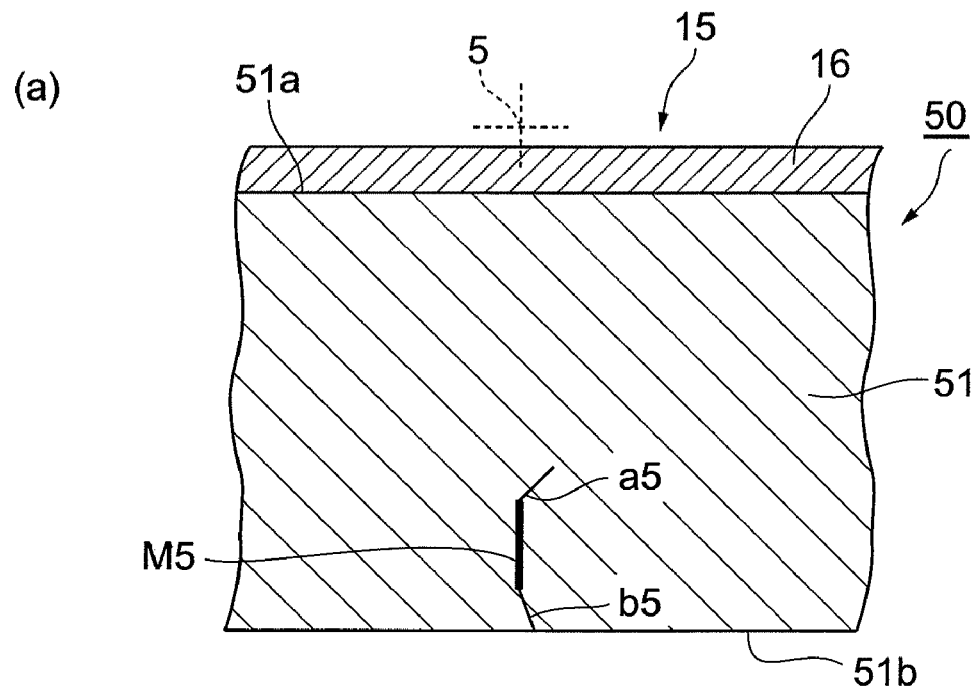
[FIG. 20] is a view for explaining the laser processing method in accordance with a second embodiment of the present invention.
Figure 20:
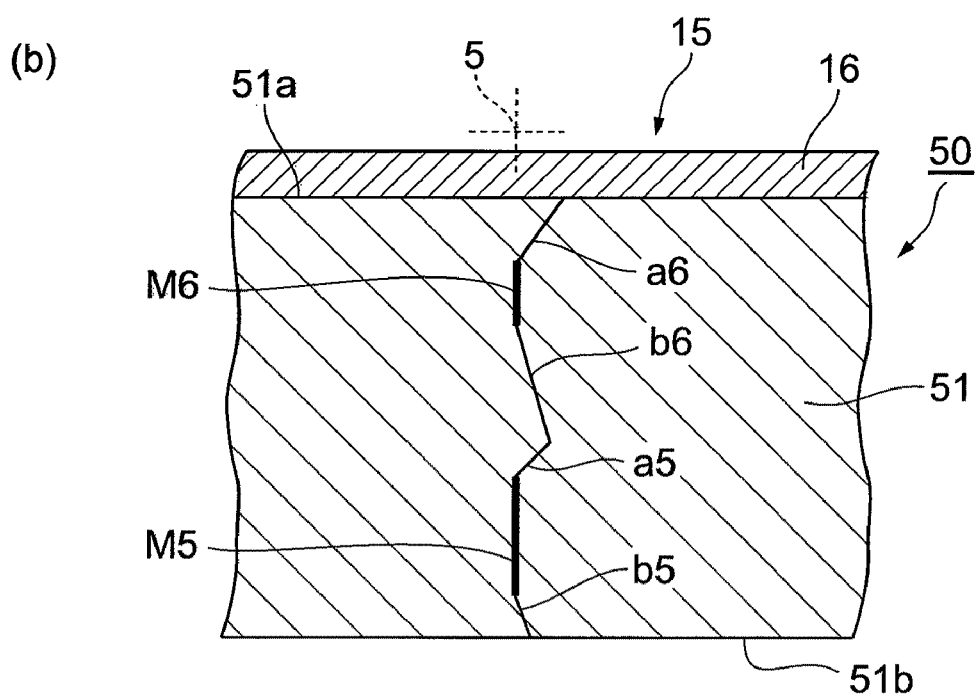

As shown in FIG. 20(*a*), a modified region M5 is formed within the silicon wafer 51 in the vicinity of the rear face 51*b*, and fractures a5 and b5 extending in the first and second cleavage directions of the silicon wafer 51 are generated from the upper and lower ends of the modified region M5, respectively. Subsequently, as shown in FIG. 20(*b*), a modified region M6 is formed within the silicon wafer 51 in the vicinity of the front face 51*a*, a fracture a6 extending in the first cleavage direction of the silicon wafer 51 is generated from the upper end of the modified region M6, and a fracture b6 extending in the second cleavage direction of the silicon wafer 51 is generated from the lower end of the modified region M6. This connects the fractures a5, a6, b5, b6 together, thereby forming irregular surfaces along these fractures.

The laser processing method in accordance with the second embodiment exhibits the same effects as those mentioned above in that both side parts holding the lines to cut 5 therebetween in the silicon wafer 51 mesh with each other at the time of laser processing, so as to restrain the object 50 from warping and prevent the object 50 from being cut unintentionally.

The modified regions M5 and M6 correspond to the first and second modified regions, respectively. The fractures a5, b5 correspond to the first fracture, while the fractures a6, b6 correspond to the second fracture.

Third Embodiment

The laser processing method in accordance with the third embodiment employs, as its object to be processed, an object to be processed 60 equipped with a silicon wafer 61 which is the same as the silicon wafer 11 shown in FIGS. 14 and 15 except that its thickness is 169 µm. This laser processing method differs from that of the first embodiment in that, when forming modified regions along lines to cut by irradiating the silicon wafer with laser light while locating a converging point within the silicon wafer, the modified region M3 shown in FIG. 16(c) is formed between the modified regions M1 and M2 within the silicon wafer, and thereafter a modified region is further formed between the modified regions M2 and M3 within the silicon wafer.

Figure 21:
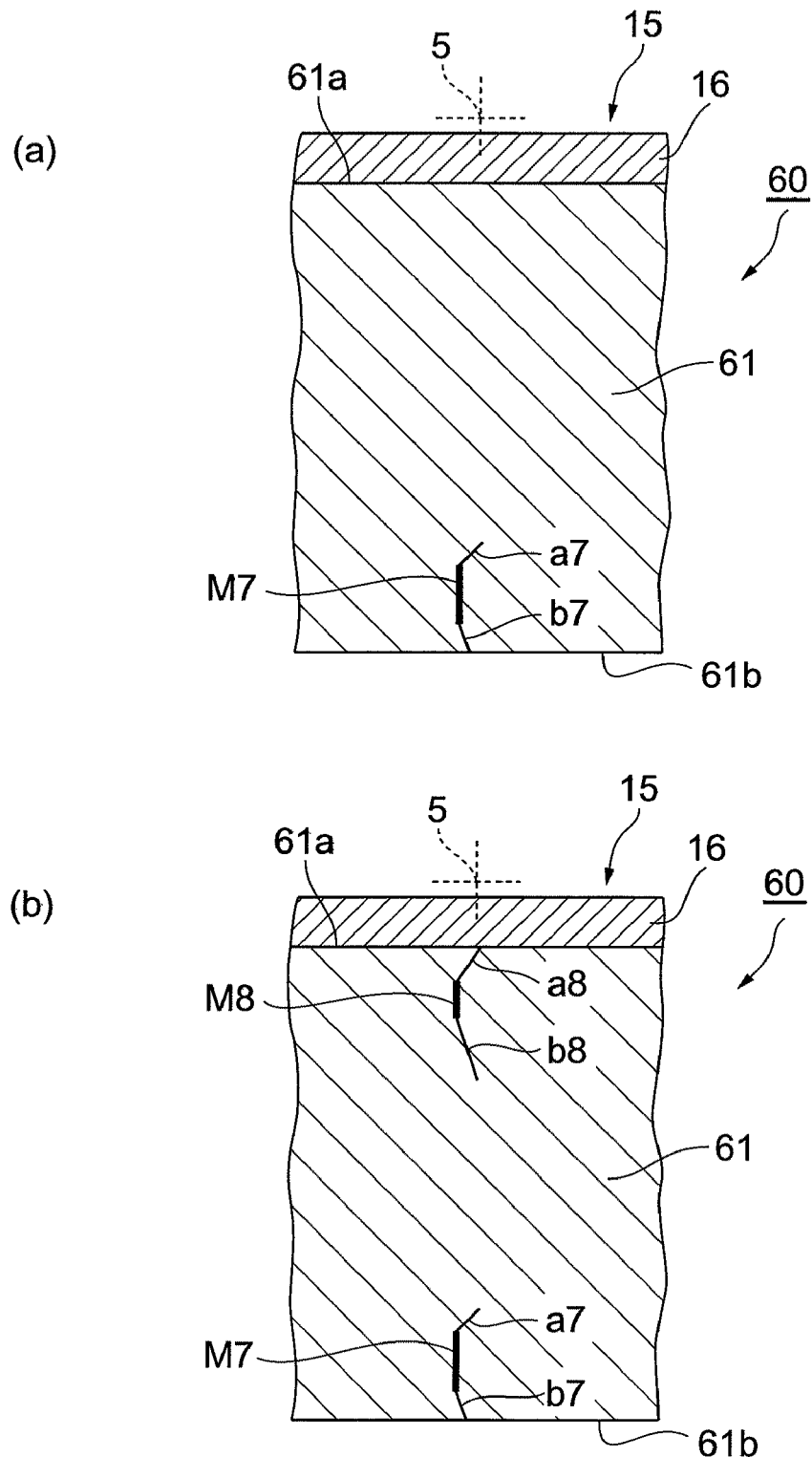
[FIG. 21] is a view for explaining the laser processing method in accordance with a third embodiment of the present invention.
Figure 22:
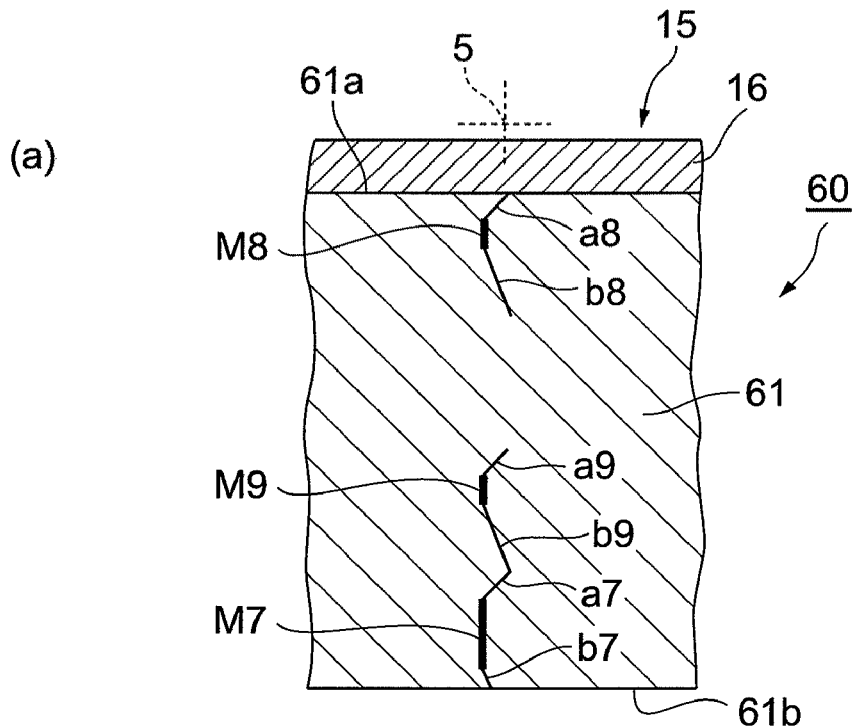
[FIG. 22] is a view for explaining subsequent states of the laser processing method shown in FIG. 21.
Figure 22:
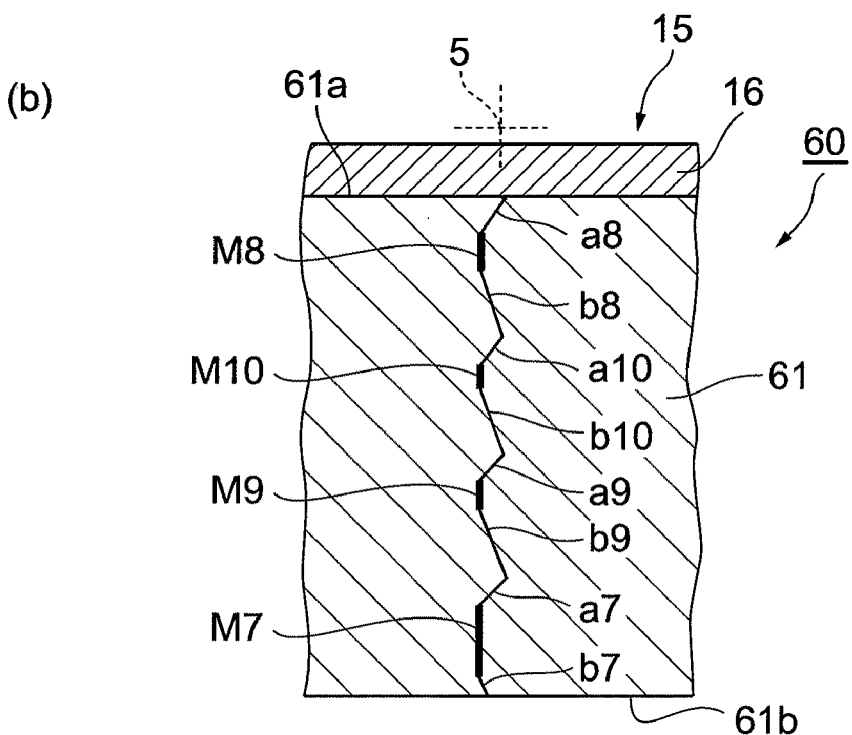

That is, as shown in FIG. 21(a), a modified region M7 is formed within the silicon wafer 61 in the vicinity of the rear face 61b, and fractures a7 and b7 extending in the first and second cleavage directions of the silicon wafer 61 are generated from the upper and lower ends of the modified regions M7, respectively. Subsequently, as shown in FIG. 21(b), a modified region M8 is formed within the silicon wafer 61 in the vicinity of the front face 61a, and fractures a8 and b8 extending in the first and second cleavage directions of the silicon wafer 61 are generated from the upper and lower ends of the modified regions M8, respectively.

Next, as shown in FIG. 21(c), a modified region M9 is formed between the modified regions M7 and M8 on the modified region M7 side within the silicon wafer 61, a fracture a9 extending in the first cleavage direction of the wafer 61 is generated from the upper end of the modified region M9, and a fracture b9 extending in the second cleavage direction of the wafer 61 is generated from the lower end of the modified region M9.

Subsequently, as shown in FIG. 21(d), a modified region M10 is formed between the modified regions M7 and M8 on the modified region M8 side, i.e., between the modified regions M8 and M9, within the silicon wafer 61, a fracture a10 extending in the first cleavage direction of the silicon wafer 61 is generated from the upper end of the modified region M10 so as to connect with the fracture b8 extending from the lower end of the modified region M8, and a fracture b10 extending in the second cleavage direction of the silicon wafer 61 is generated from the lower end of the modified region M10 so as to connect with the fracture a9 extending from the upper end of the modified region M9. The foregoing connects the fractures a7, a8, a9, a10, b7, b8, b9, b10 together, thereby forming irregular surfaces along these fractures.

Therefore, in the laser processing method in accordance with the third embodiment, both side parts holding the lines to cut 5 therebetween in the silicon wafer 61 can mesh with each other and reduce internal stresses occurring when the modified regions M7, M8, M9, M10 are formed. Also, in this embodiment, areas where both side parts holding the lines to cut in the silicon wafer mesh with each other are wider than those in the earlier embodiments, whereby the internal stresses are further lowered. This further restrains the object 60 from warping and further prevents the object 60 from being cut unintentionally at the time of laser processing.

When the modified region M8 is taken as the first modified region, the modified regions M10 and M9 correspond to the second and third modified regions, respectively. In this case, the fractures a8, b8 correspond to the first fracture, the fractures a10, b10 correspond to the second fracture, and the fractures a9, b9 correspond to the third fracture. When the modified region M9 is taken as the first modified region, on the other hand, the modified regions M10 and M8 correspond to the second and third modified regions, respectively. In this case, the fractures a9, b9 correspond to the first fracture, the fractures a10, b10 correspond to the second fracture, and the fractures a8, b8 correspond to the third fracture.

Though preferred embodiments of the present invention are explained in the foregoing, the present invention is not limited thereto. For example, though silicon wafers whose front face is a (111) surface are used as objects to be processed in the above-mentioned embodiments, any wafer having a cleavage plane in a direction different from the thickness direction is sufficient. When generating a fracture in a direction parallel to the thickness direction and tilted with respect to the surface including the lines to cut, it is not necessary for the silicon wafers to have a cleavage plane in a direction different from the thickness direction.

Semiconductor compound materials such as gallium arsenide, piezoelectric materials, and crystalline materials such as sapphire, for example, may be used instead of the silicon wafers.

Industrial Applicability

The present invention can restrain the object to be processed from warping at the time of laser processing.

The invention claimed is:

1. A laser processing method for irradiating a planar object to be processed with laser light while locating a converging point of the laser light within the object, so as to form a modified region serving as a cutting start point within the object along a cutting line, the method including the steps of:
    forming a first modified region within the object and generating a first fracture inside of the object from the first modified region extending in a direction substantially parallel to a thickness direction of the object and tilted with respect to a plane extending in the thickness direction and including the cutting line;
    forming a second modified region within the object and generating a second fracture inside of the object from the second modified region extending in a direction substantially parallel to the thickness direction of the object and tilted with respect to the plane including the cutting line so as to connect the second fracture with the first fracture; and
    cutting the object along the cutting line from the first and second modified regions by using each of the first and second modified regions as a cutting start region to thereby form an irregular cut section along the first and second fractures as viewed from a side of the object in a direction of the cutting line.

2. A laser processing method according to claim 1, further including the step of irradiating the object with laser light while locating a converging point of the laser light within the object, so as to form a third modified region serving as a cutting start point within the object along the cutting line, and generating from the third modified region a third fracture extending in a direction substantially parallel to the thickness direction of the object and tilted with respect to the plane including the cutting line;
    wherein the second fracture is generated from the second modified region so as to connect with the third fracture in the step of forming the second modified region and generating the second fracture.

3. A laser processing method according to claim 1, wherein the object comprises a crystal structure having a cleavage plane along a direction substantially parallel to the thickness direction of the object and tilted with respect to the plane including the cutting line.

4. A laser processing method according to claim 2, wherein the object comprises a crystal structure having a cleavage plane along a direction substantially parallel to the thickness direction of the object and tilted with respect to the plane including the cutting line.

5. A laser processing method according to claim 1, wherein the object comprises a semiconductor substrate, and wherein the modified region includes a molten processed region.

\* \* \* \* \*